(12) United States Patent
Vogt et al.

(10) Patent No.: US 10,935,193 B2
(45) Date of Patent: Mar. 2, 2021

(54) WAVELENGTH CONVERSION OF PRIMARY LIGHT BY MEANS OF A CONVERSION BODY

(71) Applicant: OSRAM GmbH, Munich (DE)

(72) Inventors: Peter Vogt, Kelheim (DE); Andre Nauen, Regensburg (DE)

(73) Assignee: OSRAM GmbH, Munich (DE)

( * ) Notice: Subject to any disclaimer, the term of this patent is extended or adjusted under 35 U.S.C. 154(b) by 637 days.

(21) Appl. No.: 15/745,139

(22) PCT Filed: Jun. 2, 2016

(86) PCT No.: PCT/EP2016/062481
§ 371 (c)(1),
(2) Date: Jan. 16, 2018

(87) PCT Pub. No.: WO2017/012763
PCT Pub. Date: Jan. 26, 2017

(65) Prior Publication Data
US 2018/0119897 A1  May 3, 2018

(30) Foreign Application Priority Data
Jul. 17, 2015 (DE) .................. 10 2015 213 460

(51) Int. Cl.
*F21V 25/02* (2006.01)
*F21K 9/64* (2016.01)
(Continued)

(52) U.S. Cl.
CPC ................ *F21K 9/64* (2016.08); *F21S 41/16* (2018.01); *F21V 9/32* (2018.02); *F21V 9/38* (2018.02);
(Continued)

(58) Field of Classification Search
CPC ... B60Q 11/002; B60Q 1/0023; B60Q 1/0088
(Continued)

(56) References Cited

U.S. PATENT DOCUMENTS 5,219,444 A   6/1993 Chiaramonte et al.
5,289,352 A   2/1994 Remus et al.
(Continued)

FOREIGN PATENT DOCUMENTS

CN     1287810 A    3/2001
CN   101536197 A    9/2009
(Continued)

OTHER PUBLICATIONS

Chinese Office Action based on corresponding Application No. 201680041914, dated Jun. 28, 2019 (9 pp).
(Continued)

*Primary Examiner* — William J Carter

(57) ABSTRACT

Wavelength conversion of primary light by means of a conversion body, a conversion device and an illumination apparatus is described herein. In some aspects, a conversion body may include a main body containing a wavelength-converting phosphor. The main body may have an irradiation surface to be irradiated by primary light. The conversion body may further include at least one conduction tract mounted on the main body outside the irradiation surface. The at least one conduction track may be electrically conductive in accordance with some aspects.

20 Claims, 3 Drawing Sheets

(51) Int. Cl.
*G01N 27/20* (2006.01)
*H01S 5/00* (2006.01)
*H01S 5/068* (2006.01)
*F21V 25/00* (2006.01)
*F21S 41/16* (2018.01)
*H01S 5/0683* (2006.01)
*F21V 9/32* (2018.01)
*F21V 9/38* (2018.01)

(52) U.S. Cl.
CPC .............. *F21V 25/00* (2013.01); *F21V 25/02* (2013.01); *G01N 27/20* (2013.01); *H01S 5/005* (2013.01); *H01S 5/0683* (2013.01); *H01S 5/06825* (2013.01)

(58) Field of Classification Search
USPC .................................................. 362/459–549
See application file for complete search history.

(56) References Cited

U.S. PATENT DOCUMENTS

| | | | |
|---|---|---|---|
| 8,294,177 B2 * | 10/2012 | Yamazaki | H01L 33/507 257/100 |
| 9,214,783 B2 | 12/2015 | Nomura et al. | |
| 2008/0035923 A1 | 2/2008 | Tschmelitsch et al. | |
| 2010/0072486 A1 | 3/2010 | Offermans et al. | |
| 2010/0084962 A1 | 4/2010 | Winkler | |
| 2010/0260221 A1 | 10/2010 | Yu | |
| 2014/0009952 A1 | 1/2014 | Nomura et al. | |
| 2016/0377240 A1 * | 12/2016 | Takei | H01L 33/504 362/459 |

FOREIGN PATENT DOCUMENTS

| | | |
|---|---|---|
| CN | 203489180 U | 3/2014 |
| CN | 104595852 A | 5/2015 |
| DE | 4109657 A1 | 1/1992 |
| DE | 4125478 A1 | 2/1993 |
| DE | 102006037633 A1 | 3/2008 |
| DE | 102007010719 A1 | 9/2008 |
| DE | 102011017633 A1 | 10/2012 |
| FR | 2580403 A1 | 10/1986 |
| JP | 2001097319 A | 4/2001 |
| JP | 2010118267 A | 5/2010 |
| WO | 2012124522 A1 | 9/2012 |
| WO | 2012146467 A1 | 11/2012 |

OTHER PUBLICATIONS

Zhuang, et al. Engineering Materials and Their Applications, excerpted Sec. 12.2-12.4.2 in Chinese, 5 pages (pp. 171-175).

Japanese Office Action based Application No. 2018502112, (5 pages + 4 pages english translation), Jan. 21, 2019 (for reference purposes only).

German Search Report based on application No. 10 2015 213 460.1 (7 pages) dated Jan. 18, 2016 (Reference Purpose Only).

International Search Report based on application No. PCT/EP2016/062481 (14 pages and 3 pages of English translation) dated Nov. 2, 2016 (Reference Purpose Only).

\* cited by examiner

WAVELENGTH CONVERSION OF PRIMARY LIGHT BY MEANS OF A CONVERSION BODY

CROSS-REFERENCE TO RELATED APPLICATIONS

This application is a national stage entry of International Application No. PCT/EP2016/062481 under 35 U.S.C. §§ 365 and 371, filed on Jun. 2, 2016, which claims priority to German Patent Application Serial No. 10 2015 213 460.1, which was filed on Jul. 17, 2015. The disclosures of each of the foregoing documents are incorporated herein by reference in their entirety and for all purposes.

FIELD

The present disclosure relates to a conversion body, having a main body of wavelength-converting phosphor, said main body having an irradiation surface intended to be irradiated by primary light. The present disclosure also relates to a conversion device having at least one conversion body and an evaluation device, wherein the evaluation device is configured to detect a crack in the main body. The present disclosure also relates to an illumination apparatus, having at least one conversion device and at least one semiconductor primary light source for irradiating the irradiation surface of the associated main body. The present disclosure is able to be applied, for example, to wavelength-converting ceramic bodies as main bodies. For example, the present disclosure is applicable to LARP ("laser-activated remote phosphor") arrangements, and in particular to illumination apparatuses for vehicles (e.g., headlights) or for special lighting systems such as stage lighting or special-effect lighting.

BACKGROUND

It is known to irradiate primary light of a specified primary light wavelength (for example, blue light) onto a wavelength-converting ceramic body, where the primary light is at least partially converted into light of longer wavelength (for example, into yellow light) and re-emitted. The ceramic body can consist of rare-earth-doped ceramic with garnet structure (as disclosed, for example, in DE 10 2007 010 719 A1) and is typically platelet-shaped. It is typically irradiated centrally with the primary light. If the primary light is laser light and the ceramic body is spaced apart from the laser producing the primary light, the system is also known as an LARP arrangement.

During the irradiation of the ceramic body, a significant local temperature rise occurs at the irradiation surface, leading to the generation of thermally induced stresses in the ceramic body that may result in damage to the wavelength converting ceramic body due to cracking. The risk of cracking can increase over time due to repeated switching on and off switching of the primary light, as an associated thermally induced alternating load can lead to a slow crack growth.

Cracks in the wavelength converting ceramic body have previously been detected by performing complex optical analysis of the light emitted from the ceramic body.

SUMMARY

An aspect of the present disclosure is to overcome the disadvantages of the prior art, at least in part, and in particular, to provide a simple and inexpensive means by which damage to a phosphorescent body due to cracking can be detected.

The aspect of the present disclosure may be achieved by the features of the present disclosure. In particular, advantageous embodiments are disclosed in the present disclosure.

The object of the present disclosure may be achieved by a conversion body, which has a main body of wavelength-converting phosphor, which has at least one irradiation surface intended for irradiation with primary light, and at least one electrically conductive conduction track mounted on the main body outside the irradiation surface.

This conversion body provides the advantage that a crack through the main body also propagates through an electrical conduction track, which is permanently connected to the main body, since the crack edges forming in the main body also pull off or tear off the electrical conduction track adjacent thereto and thereby damage it. The damage to the conduction track can be detected easily and cost-effectively, and very accurately, with an electrical evaluation device. The damage to the conduction track can thus be used to infer damage to the main body.

This exploits the fact when the main body is irradiated, it undergoes a thermally induced, radially-oriented compression at the irradiation surface, by means of which the ceramic body is pressed radially outwards, and especially in areas outside of the irradiation surface. This, in turn, produces stresses acting in a circumferential direction around the irradiation surface, which can cause cracking. Since the propagation direction of the cracks is highly predictable from the shape of the main body and the stress distribution in the main body, the course of the cracks is also highly predictable. By laying the at least one conduction track in a suitable manner, a crack formation can then also be detected with high probability from the associated damage to at least one conduction track.

A conversion body is understood in particular to mean an integral body (i.e., not divisible in a non-destructive way), which includes the main body and the at least one electrically conductive conduction track permanently connected thereto.

A conduction track is understood in particular to mean an almost one-dimensional electrical conductor, i.e., that a longitudinal extension of the conductor is considerably greater (in particular by at least a factor 2, in particular by at least an order of magnitude) than its width and height. The conduction track can, for example, be a wire incorporated into the main body or a surface-mounted conductor track on the main body.

However, in principle the conduction track can have essentially any shape and also be designated more generally as a conductor surface. This applies in particular if a location of any possible future cracking is well known.

In one extension, the main body is a brittle body. This cracks close to its elastic limit with little or no plastic deformation, i.e., by brittle fracture.

The main body includes fluorescent phosphor or consists of fluorescent phosphor, and can therefore convert or transform incident primary light, at least partially, into secondary light of a different wavelength. In the presence of a plurality of phosphors, this can generate secondary light of different wavelengths from each other. The wavelength of the secondary light may be longer (so-called "Down conversion") or shorter (so-called "Up conversion") than the wavelength of the primary light. For example, by means of a phosphor, blue primary light can be converted into green, yellow, orange-colored or red secondary light. In the case of only partial wavelength transformation or wavelength conversion, a mixture of secondary light and non-converted primary light is emitted by the main body, which can serve as useful light. For example, white useful light can be generated from a mixture of blue, non-converted primary light and yellow secondary light. However, a full conversion is also possible, in which the useful light is either no longer present in the useful light at all, or only in a negligible proportion. A degree of conversion will depend, for example, on a thickness and/or a phosphor concentration of the main body. In the presence of a plurality of phosphors, secondary light components of different spectral composition can be generated from the primary light, for example, yellow and red secondary light. The red secondary light may be used, for example, to give the useful light a warmer tone, for example, "warm white". Given the availability of more than one fluorescent phosphor, at least one phosphor may be suitable for wavelength-converting secondary light once more, e.g., green secondary light into red secondary light. Light produced from a secondary light by repeated wavelength conversion may also be referred to as "tertiary light".

In one possible configuration, the main body is a small fluorescent plate, the irradiation surface of which is located on one flat side. The irradiation surface may in particular be centrally positioned on the flat side. In particular, a central arrangement is defined as an arrangement in which the irradiation surface does not reach as far as the edge of the fluorescent platelet, but is spaced apart from it on all sides.

In a further configuration, at least one conduction track (designated in the following, without loss of generality, as an "edge-side conduction track") extends along at least a portion or section of a (free) edge of the flat side, which includes the irradiation surface. This results in the advantage that a crack formation in the main body can be detected particularly early. The effect exploited here is that, due to the central radial compression of the main body when the irradiation surface is heated, tensile stresses in the circumferential direction are generated at the free edge, which will develop or open any pre-existing damage sites to form cracks more easily there than in the interior of the main body. Furthermore, crack initiation points (such as notches, incipient cracks, among others) tend to occur more frequently at the edge than in the main body. Therefore, cracks often appear at the edge of the main body first.

The arrangement "along" the edge may include the fact that the conduction track is directly adjacent to the edge and possibly even covers the edge side or narrow side adjacent to the edge. If the conduction track is a wire, then an arrangement directly adjacent to the edge can mean an arrangement of the wire which brings the wire as close to the edge as practically possible in respect of production techniques.

The arrangement "along" the edge can also include the fact that the conduction track is only a small distance away from the edge. The small distance can be, for example, no more than 200 microns, in particular no more than 100 microns, in particular no more than 75 microns, in particular no more than 50 microns, in particular no more than 25 microns.

In an extension thereof, a plurality of edge-side conduction tracks extends along the respective parts or sections of the edge of the flat side.

In a further configuration, the edge-side conduction track extends almost (i.e., up to a specified (narrow) interruption in the conduction track) along the entire edge of the flat side including the irradiation surface. This produces the advantage that cracks initiated at the edge side can be detected with a particularly high probability. The interruption (e.g., a narrow gap) is used to prevent a short circuit in the conduction track.

In a further configuration, the edge-side conduction track extends along at least one pre-existing mechanical damage site (selectively) introduced on the edge side. This means that a location of a possible first crack formation can be specifically predefined, enabling a particularly reliable detection of thermal overloading. This also allows a triggering threshold for the tensile stress to trigger the crack to be set at least approximately. A further advantage obtained is that a particularly small amount of material of the conduction track is required, and the shape of the conduction track can be chosen particularly freely (e.g., in the context of a conduction surface). The pre-existing damage can be a notch.

A further configuration provides that at least one other conduction track extends between the edge-side conduction track and the irradiation surface. As a result, a progress of a crack propagation can be detected particularly reliably. For example, even a short crack can be detected by a change in the electrical properties of the edge-side conduction track and a further crack propagation in the direction of the irradiation surface can be detected by a change in the electrical property of the at least one other conduction track.

A further configuration provides that at least one additional conduction track extends a distance apart from and similar in shape to the edge-side conduction track. This means that a crack progression with a predetermined crack length can be detected at least approximately from virtually all edge positions.

A further configuration provides that the main body consists of wavelength converting ceramic, for example, of rare-earth-doped ceramic with a garnet structure.

In an alternative extension, the main body consists of a brittle matrix material, in which the powdered phosphor particles are embedded. The brittle matrix material can be glass, for example.

A further configuration also provides that at least one electrically conductive conduction track is a conductor track, in particular a metallic conductor track. A conductor track can be applied cost-effectively to a surface of the main body particularly simply, precisely and in a finely structured way.

In one extension, at least one metallic conductor track consists of aluminum. Aluminum has the advantage that it is comparatively soft and ductile, and therefore in the case of a crack propagation in the main body below the conduction track, cracks readily at the same time. In particular, it is thus possible to prevent a crack from passing through underneath the conduction track, without damaging it. The aluminum can be sputtered on aluminum, for example. A thickness of the aluminum can be, for example, 100 nanometers (nm) to 300 nm, in particular, approximately 200 nm.

In a further configuration it is provided that the electrically conductive conduction track is a wire embedded in the main body and in particular including tungsten (i.e., consisting of pure tungsten or a tungsten alloy). This produces the advantage that the conduction track is particularly insensitive to temperature and also robust to unwanted irradiation with the primary light. In a further extension, the wire can be embedded in the main body on all sides.

As tungsten and tungsten alloys are highly temperature-resistant, they can be permanently incorporated in the main body by inserting into a green body forming the main body and sintering them conjointly with the green body.

In a further configuration, the electrically conductive conduction track (in particular, conductor track) has a width between 100 microns and 750 microns, in particular between 100 microns and 500 microns, in particular between 100 microns and 300 microns, in particular between 150 microns and 250 microns, and in particular of approximately 200 microns. This has proved to be a particularly advantageous size for reliably detecting a change of an electrical property of the conduction track and a sufficiently early crack detection.

In one configuration, the at least one conduction track is applied on one side of the main body, which enables a particularly simple production. This side can be the same flat side on which the irradiation surface is located. Alternatively, it can also be the flat side facing away from the irradiation surface.

In an alternative design, at least one conduction track is applied on both flat sides of the main body, in particular each of the conduction tracks being of the same shape.

In a still further extension, in a plan view of its flat side, the main body has a circular or rectangular shape, which also corresponds to the shape of the edge. However, the shape of the body is not restricted thereto.

In particular, if the main body has a circular shape, its diameter can have a size of between one and two millimeters.

The aspect of the present disclosure may also be achieved by a conversion device, having at least one conversion body as described above, and an evaluation device electrically connected to the at least one conduction track, the evaluation device being configured to detect a crack in the main body on the basis of a change in an electrical property of at least one conduction track.

As a result, a crack can be detected significantly more accurately and cost-effectively than with optical methods.

The conversion device can be designed analogously to the conversion body and results in the same advantages.

The evaluation device can be configured, for example, to determine an electrical resistance of the at least one conduction track, a voltage or a current flowing through the conduction track. Thus, the conduction track can be monitored, for example, by means of a simple voltage measurement, for example using a series resistor R1 connected in series with a conduction track. Alternatively, the series resistor R1 and at least one conduction track can be used as a variable resistor in a voltage divider, and the divided voltage can thus be monitored.

If the conduction track is not damaged (case without cracking), the electrical resistance may be low and an electrical current conducted through it will be high. In the case of damage to the conduction track due to cracking, the electrical properties change in a measurable way, e.g., by the electrical resistance increasing and the electric current decreasing. The evaluation device can also measure other electrical properties, however, such as a voltage or a capacitance. The measurement device and the evaluation device connected thereto are particularly suited to detecting abruptly changing measurement signals (e.g., voltage measurements) and measurement signals with rapidly varying curve shapes, such as a sudden increase in the slope of the curve (according to, for example, a first-order derivative of the measurement signal). Furthermore, the measuring device and/or the evaluation device can have a data memory, which in particular stores measurements that were measured in a non-operating state or in an "off" phase of the conversion device, and makes them available for retrieval. This enables measuring signals available in chronological sequence to be compared with each other in the non-operating state, which can be used for calibration of the measuring device or the evaluation device connected thereto. For example, it is thus possible to take into account increased resistance values due to an ambient temperature increase during the analysis and, if necessary, compensate for them during an analysis.

In one extension, it is provided that the evaluation device is configured to detect a crack in the main body by means of a reduction of a cross-sectional area of the conduction track induced as a result of the crack. This means that cracks can be detected in the main body at a particularly early stage, in particular in the case of a slow (specifically sub-critical) crack growth.

One configuration provides that the evaluation device is configured to detect a crack in the main body on the basis of a break in at least one conduction track. This allows it to be determined particularly clearly and quickly, for example, due to an abrupt change of a resistance value to virtually infinity, or else a current drop to virtually zero.

In a further configuration, the evaluation device is configured, upon detecting an incidence of damage, in particular a breakage, of the edge-side conduction track, to trigger at least a first action and upon detecting an incidence of damage, in particular a breakage, of at least one other conduction track, to trigger at least a second action, in particular a deactivation or shutdown of an irradiation of the main body. This enables a graduated response to a crack propagation to be achieved, which is particularly advantageous in the case where the crack progresses fairly slowly from the edge-side conduction track to the other conduction track, which is located closer to the illumination surface. Shutting down the irradiation of the main body prevents the irradiation surface being irradiated if a crack passes through it. This in turn prevents an emission of coherent primary light, and therefore an eye hazard, if the main body is damaged or even destroyed. The shutdown of the irradiation of the main body can be implemented by switching off the semiconductor light source(s) or by introducing a screen into a light path of the primary light.

In one extension it is provided that the at least one first action includes reducing a radiant power of the primary light. Thus, a crack progress can be slowed down and the continued irradiation can be used to maintain an "emergency light function".

In a further extension, the at least one first action can include issuing a warning signal, e.g., to a higher-level entity, for example to output a warning signal to a user, a control center, among others.

A further configuration provides that the conversion device represents a part of an illumination apparatus, in particular a vehicle illumination apparatus or an effect, stage or outdoor lighting system. The vehicle illumination apparatus may be provided, in particular, for the outside lighting of the vehicle, for example in the form of a headlight. The headlight can have, for example, a lower beam, a higher beam, a fog light, a cornering light and/or a daytime running light function, among others.

The aspect of the present disclosure may also be achieved by an illumination apparatus, having at least one conversion body as described above and/or at least one conversion device as described above, and having at least one semiconductor primary light source for irradiating the irradiation surface of the associated main body.

The at least one semiconductor primary light source can have, or be, at least one laser diode and/or at least one light emitting diode.

In one configuration, the evaluation device is coupled to the at least one semiconductor primary light source, possibly via a control device, such as an on-board set of electronics of a vehicle, or via a control panel of an effect lighting system.

The illumination apparatus can operate the conversion body or the main body in a transmissive arrangement, in which useful light is radiated by the main body, which is on the opposite side to the irradiation area. The useful light can correspond to the secondary light in the case of full conversion and to a mixture of non-converted primary light and secondary light in the case of partial conversion.

Additionally or alternatively, the illumination apparatus can operate the conversion body or the main body in a reflective arrangement, in which useful light is radiated by the main body on the side which also contains the irradiation surface.

BRIEF DESCRIPTION OF THE DRAWINGS

The properties, features and advantages of the present disclosure described above and the manner in which these are achieved, will become clearer and more comprehensible in conjunction with the following description of an embodiment, which is explained in more detail in connection with the drawings. For clarity of exposition, identical or equivalent functional elements are labeled with the same reference numeral.

DETAILED DESCRIPTION

Figure 1:
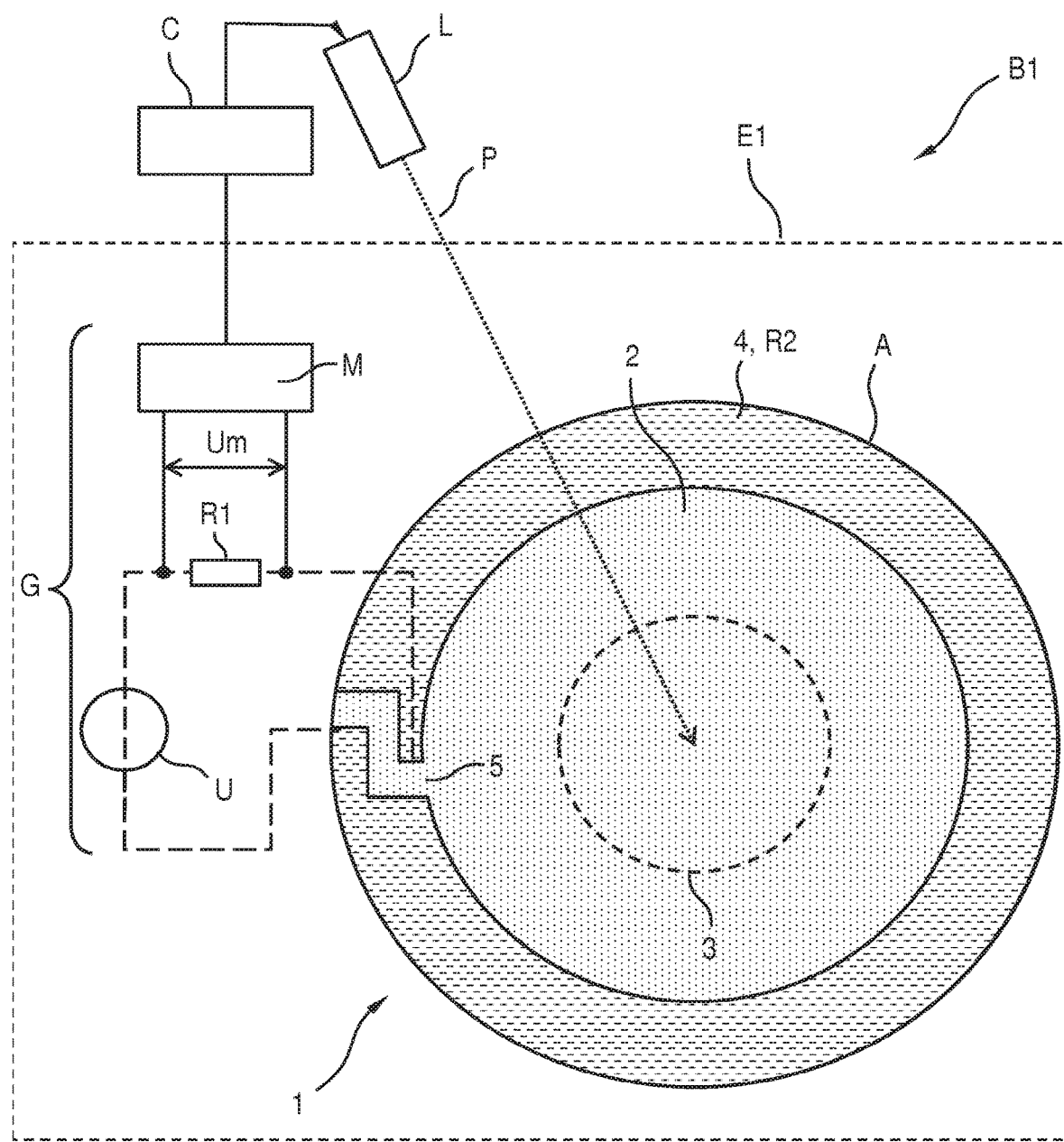
FIG. 1 shows a plan view of an illumination apparatus having a conversion body according to a first embodiment.

FIG. 1 shows a plan view of an illumination apparatus B1 with a conversion device E1, which has a conversion body 1 according to a first embodiment.

The conversion body 1 has a circular-disc-shaped main body 2 formed of wavelength-converting ceramic, which can also be designated as a circular conversion ceramic platelet. Centrally on the front side of the main body 2 shown, an imaginary irradiation surface 3 is provided, which is to be irradiated with—for example blue—primary light P. There should be little or no primary light P incident outside the irradiation area 3.

An electrically conductive conduction track is applied on at least the front side of the main body 2 shown, in the form of an, e.g., sputtered-on conductor track 4 made of aluminum. The conductor track 4 is almost completely annular in shape and has an outer contour that extends up to an edge A of the main body 2. The conductor track 4 therefore extends almost completely along the edge A. Only one gap-like interruption 5 is present where the conductor track 4 is split or interrupted, in order to prevent a short circuit when an electric current flows.

The conductor track 4 has a width of approximately 200 microns and a thickness of approximately 200 nanometers (nm). A diameter of the main body 2 is approximately one to two millimeters (mm).

An evaluation device G is connected to the open ends of the conductor track 4 of the conversion device E1, which has a DC voltage source U and a series resistor R1. The series resistor R1 is connected to the DC voltage source U in series with the conductor track 4. The voltage present at the series resistor R1 can be sensed using a measuring device M associated with the evaluation device G. The voltage measurements determined by the measuring device M can be used by a control device C connected to the measuring device M to activate a primary light source in the form of at least one laser L. The control device C can either be part of the evaluation device G, or a stand-alone component. The control device C and the evaluation device G can also be integrated into a component, e.g., into a control device C with evaluation function. The conversion device E1, including the evaluation device G and the conversion body 1, can be in the form of a module.

In one configuration, the illumination apparatus B1 can be operated as follows:

The control device C activates the at least one laser L in such a way that the laser irradiates the illumination surface 3 with primary light P of a standard radiant power. If the main body 2 is free of cracks, the conductor track 4 is also crack-free and, for practical purposes, has an electrical resistance $R2 \approx 0$. The measuring device M then measures the voltage U generated by the DC voltage source across the series resistor R1 as the measuring voltage Um, so that for practical purposes, U=Um.

If a crack (not illustrated) is initiated at the edge A, it extends into the inside of the main body 2 and generates an analogous crack or a corresponding discontinuity in the conductor track 4. If the crack has only partially spread into an area below the conductor track 4, the conductor track 4 starts to crack, but is not yet fully interrupted. The resistance R2 increases to a measurable finite value due to the resulting cross-sectional constriction. The measuring device M then measures a measuring voltage Um across the series resistor R1 with a value $Um=R1/(R1+R2) \cdot U$. In one variant, the control device C can at this point already reduce a radiation power of the at least one laser L, to slow down or even initially prevent any further crack propagation.

If the crack has fully crossed the main body 2 underneath the conductor track 4 and thereby also cut through or interrupted the conductor track 4, then the measuring device M measures a value Um=0, which can be very reliably detected. In one variant, the control device C can then already (even further) reduce a radiation power of the at least one laser L, to slow down or even initially prevent any further crack propagation. It can, in particular, reduce the radiant power of the primary light P to zero (in particular turn off or disable the laser L), in order to reliably prevent a further crack propagation.

This protective function is used, in particular, to prevent an escape of concentrated primary light P from the illumination apparatus B1 due to a damaged main body 2.

Figure 2:
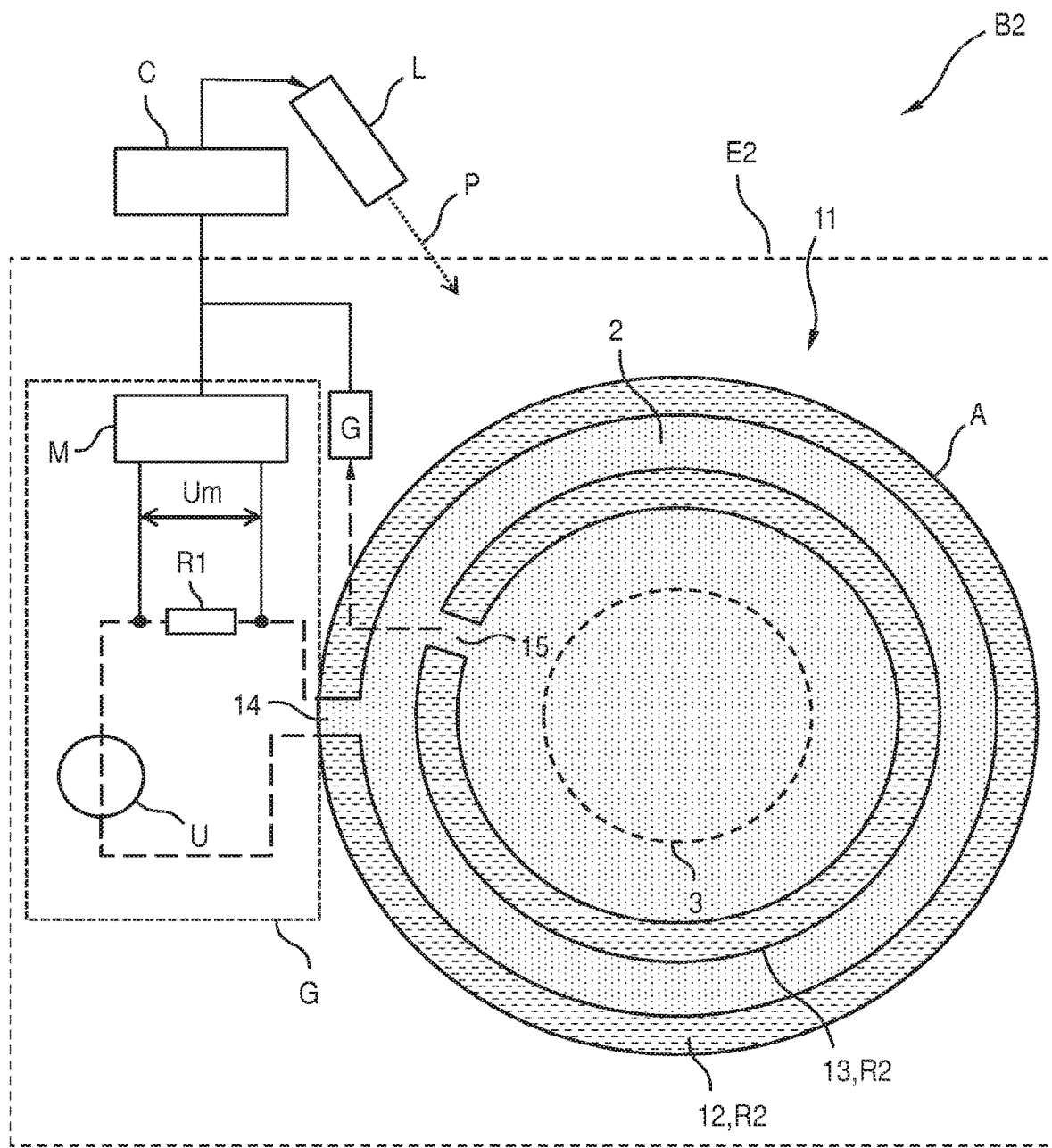
FIG. 2 shows a plan view of a conversion body according to a second embodiment.

FIG. 2 shows a plan view of an illumination apparatus B2 having a conversion body 11 according to a second embodiment. The conversion body 11 has two annular conductor tracks 12 and 13, arranged concentrically on the main body 2, of which one conductor track 12 is an edge-side conductor track similar to the conductor track 4. The conductor track 12 can be so thin that in the event of any crack beginning to form especially at the edge of the main body 2, its fracture can be practically measured and evaluated. The other conductor track 13 runs between the edge-side conductor track 12 and the irradiation surface 3. The other conductor track 13 is designed, like conductor track 12, to have an annular form and therefore a similar shape thereto. The narrow discontinuities 14 and 15 of the conductor tracks 12 and 13 are offset at an angle to each other, in order to prevent a crack from propagating through both discontinuities 14 and 15. Electrical connection cables (not shown) between the measuring device M and the conductor track 13 can be advantageously routed through the discontinuity 14 of the edge-side conductor track 12, for example in the form of thin, narrow, conductor track-like aluminum coatings or optically transparent ITO conductor tracks.

In an extension, it is provided that electrical properties of the conductor tracks 12 and 13 can be sensed in a similar manner to the conductor track 4, for example, a respective measuring voltage Um can be measured, in particular, individually for each one of the two conductor tracks 12 and 13. To this end, two evaluation devices G can be present, but which can also be at least partially integrated, e.g., by using a common DC voltage source U. A conversion device E2 can then include the conversion body 11 and both evaluation devices 9.

The control device C can then use each measured voltage Um for activating the at least one laser L.

The illumination apparatus B2 can then be operated—in particular, in the same way as the illumination apparatus of B1 FIG. 1—in a configuration as follows:

A control device C activates the at least one laser L in such a way that the laser irradiates the illumination surface 3 of the main body 2 with primary light P of a standard radiant power.

If the main body 2 is free of cracks, the conductor tracks 12 and 13 are also crack-free and, for practical purposes, have an electrical resistance $R2 \approx 0$. The (individual or joint) measuring device M then measures the DC voltage U generated by the (individual or joint) DC voltage source U across a respective series resistor R1 as the measured voltage Um.

If a crack (not shown) is triggered at the edge A of the main body 2, this crack spreads into the interior of the main body 2 and first cuts through the edge-sided conductor track 12, so that this is interrupted. The control device C can at this point reduce a radiant power of the at least one laser L, to slow down or even initially prevent any further crack propagation.

With the splitting of the edge-side conductor track 12, the control device C can also trigger other actions, for example, issuing a warning to a user of the illumination apparatus B2 and/or informing a service entity (e.g., a workshop).

If the crack has crossed the main body 2 below the conductor track 13 and thereby also cut through or interrupted the conductor track 13, the control device C can then, for example, reduce the radiant power of the primary light P to zero (in particular, switch off or deactivate the laser L), in order to reliably prevent any further crack propagation and/or prevent irradiation of an already cracked irradiation surface 3.

This protective function is also used to prevent an escape of concentrated primary light P from the illumination apparatus B2 due to a damaged main body 2.

Figure 3:
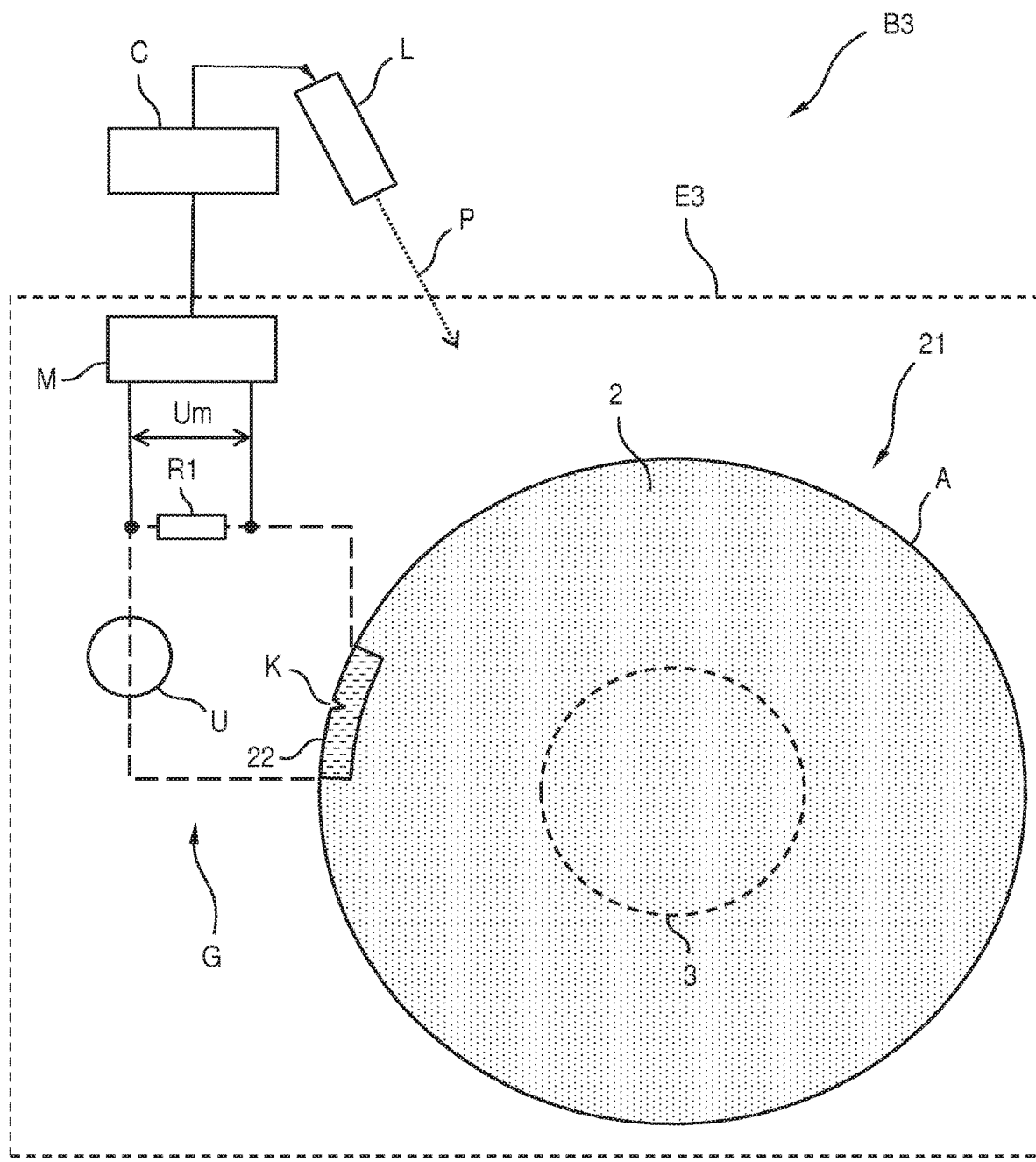
FIG. 3 shows a plan view of a conversion body according to a third embodiment.

FIG. 3 shows a plan view of an illumination apparatus B3, which has a conversion device E3 with a conversion body 21 according to a third embodiment.

The illumination apparatus B3 can be operated, for example, similarly to the illumination apparatus B1. However, the conductor track 22 is then not designed to run circumferentially around the edge, but only along a short section or sector (e.g., of not more than 45°, in particular of not more than 20°, and in particular of not more than 10°, of the total circumference or edge A). In order, nevertheless, to be able to reliably detect a mechanical overloading of the main body 2 by a thermally induced edge-side tensile stress due to irradiation of the irradiation surface 3 with the primary light P, on the section of the edge A, on which the conductor track 22 is located, a selectively applied, predefined damage site in the form of a (micro-)notch K is present. If the tensile stress at the edge A reaches an at least roughly adjustable threshold, then an internally oriented crack is formed at the notch K, which can be detected by a break etc. in the conductor track 22.

A plurality of conductor tracks 22 with respective notches K can also be provided, for example, evenly distributed around the edge A or the circumference.

Although the present disclosure has been illustrated and described in greater detail by means of the embodiments shown, the present disclosure is not restricted thereto and other variations can be derived therefrom by the person skilled in the art without departing from the scope of protection of the present disclosure.

Thus, instead of a conductor track made of aluminum a track made of another metal such as copper or tin can also be used. Also, instead of a conductor track it is possible to provide a wire, in particular made from or with tungsten, which is embedded in the body.

The shape of main body and the conductor track(s) can also be oval, cornered (for example, rectangular, in particular square) and generally free-form.

In addition, more than one additional conductor track can also be provided.

In general, the word "a", "one" can mean a singularity or a plurality, in particular in the sense of "at least one" or "one or more", and so on, except where this is explicitly excluded, for example by the expression "exactly one", etc.

Also, a numerical value can include both exactly the specified number and also the standard tolerance range, unless this is explicitly excluded.

REFERENCE NUMERALS 1 conversion body
2 main body
3 irradiation surface
4 conductor track
5 discontinuity
11 conversion body
12 edge-side conductor track
13 additional conductor track
14 discontinuity of the edge-side conductor track
15 discontinuity of the additional conductor track
21 conversion body
22 conductor track
A edge of the main body
B1 illumination apparatus
B2 illumination apparatus
B3 illumination apparatus
C control device
E1 conversion device
E2 conversion device
E3 conversion device
G evaluation device
K notch
L laser
M measurement device
P primary light
R1 series resistor
R2 resistance of the conductor track
U DC voltage source
Um measured voltage

The invention claimed is:

1. A conversion body, comprising:
   a main body comprising a wavelength-converting phosphor, the main body having an irradiation surface to be irradiated by primary light;
   at least one conduction track mounted on the main body outside the irradiation surface, the at least one conduction track being electrically conductive; and an evaluation device connected to the at least one conduction track, the evaluation device being configured to detect a crack in the main body based on a change in an electric property of the at least one conduction track.

2. The conversion body of claim 1,
   wherein the main body is a phosphor platelet, and
   the irradiation surface is centered on a flat side of the main body.

3. The conversion body of claim 2,
   wherein at least one edge-side conduction track extends along at least a portion of an edge of the flat side comprising the irradiation surface.

4. The conversion body of claim 3,
   wherein the at least one edge-side conduction track extends along an entire length of the edge of the flat side comprising the irradiation surface.

5. The conversion body of claim 3,
   wherein the at least one edge-side conduction track extends along at least one mechanical damage site introduced at the edge of the flat side.

6. The conversion body of claim 4,
   wherein at least one other conduction track extends between the at least one edge-side conduction track and the irradiation surface.

7. The conversion body of claim 6,
   wherein at least one additional conduction track is offset from the at least one edge-side conduction track by a distance.

8. The conversion body of claim 1,
   wherein the main body consists of a wavelength-converting ceramic.

9. The conversion body of claim 1,
   wherein the at least one conduction track comprises aluminum.

10. The conversion body of claim 1,
    wherein the at least one conduction track is a wire embedded in the main body, and
    the wire comprises tungsten.

11. The conversion body of claim 1,
    wherein the at least one conduction tract has a width between 100 microns ($\mu m$) and 750 $\mu m$, and
    the at least one conduction tract has a thickness between 100 nanometers (nm) and 300 nm.

12. The conversion body of claim 1,
    wherein a diameter of the main body is between one millimeter to two millimeters.

13. The conversion body of claim 1,
    wherein the at least one conduction track comprises copper or tin.

14. The conversion body of claim 1,
    wherein the at least one conduction track is a surface-mounted conductor disposed on the main body.

15. The conversion body of claim 1,
    wherein the main body comprises a fluorescent phosphor.

16. A conversion device, comprising:
    at least one conversion body including
       a main body comprising a wavelength-converting phosphor, the main body having an irradiation surface to be irradiated by primary light, and
       at least one conduction track mounted on the main body outside the irradiation surface, the at least one conduction track being electrically conductive; and
    an evaluation device connected to the at least one conduction track, the evaluation device being configured to detect a crack in the main body based on a change in an electric property of the at least one conduction track.

17. The conversion device of claim 16,
    wherein the evaluation device is further configured to detect a crack in the main body based on a breakage of the at least one conduction track.

18. The conversion device of claim 17,
    wherein the main body is a phosphor platelet,
    the irradiation surface is centered on a flat side of the main body,
    at least one edge-side conduction track extends along an entire length of an edge of the flat side comprising the irradiation surface,
    at least one other conduction track extends between the at least one edge-side conduction track and the irradiation surface, and
    the evaluation device is further configured to
       trigger at least one first action upon detecting a breakage in the at least one edge-side conduction track and
       trigger a deactivation of an irradiation of the main body upon detecting a breakage of the at least one additional conduction track.

19. The conversion device of claim 16,
    wherein the conversion device is a part of an illumination apparatus.

20. An illumination apparatus, comprising:
    at least one conversion device including
       at least one conversion body containing
          a main body comprising a wavelength-converting phosphor, the main body having an irradiation surface to be irradiated by primary light and
          at least one conduction track mounted on the main body outside the irradiation surface, the at least one conduction track being electrically conductive, and
       an evaluation device connected to the at least one conduction track, the evaluation device being configured to detect a crack in the main body based on a change in an electric property of the at least one conduction track; and
    at least one semiconductor primary light source for irradiating the irradiation surface of the main body associated therewith,
    wherein the evaluation device is linked to the at least one semiconductor primary light source.

* * * * *